United States Patent
Shang et al.

(10) Patent No.: US 9,359,666 B2
(45) Date of Patent: Jun. 7, 2016

(54) RAPID CRYSTALLIZATION OF HEAVILY DOPED METAL OXIDES AND PRODUCTS PRODUCED THEREBY

(75) Inventors: Jian-Ku Shang, Mahomet, IL (US); Qi Li, Liaoning Province (CN)

(73) Assignee: The Board of Trustees of the University of Illinois, Urbana, IL (US)

( * ) Notice: Subject to any disclaimer, the term of this patent is extended or adjusted under 35 U.S.C. 154(b) by 290 days.

(21) Appl. No.: 13/256,300

(22) PCT Filed: Feb. 18, 2010

(86) PCT No.: PCT/US2010/024540
§ 371 (c)(1),
(2), (4) Date: Sep. 13, 2011

(87) PCT Pub. No.: WO2010/104656
PCT Pub. Date: Sep. 16, 2010

(65) Prior Publication Data
US 2012/0001172 A1    Jan. 5, 2012

Related U.S. Application Data

(60) Provisional application No. 61/160,109, filed on Mar. 13, 2009.

(51) Int. Cl.
| | |
|---|---|
| C04B 41/50 | (2006.01) |
| C03C 17/00 | (2006.01) |
| C03C 8/20 | (2006.01) |
| B01J 35/00 | (2006.01) |
| C23C 14/06 | (2006.01) |

(Continued)

(52) U.S. Cl.
CPC ........... *C23C 14/0676* (2013.01); *C01B 13/145* (2013.01); *C01G 19/02* (2013.01); *C01G 23/047* (2013.01); *C23C 14/081* (2013.01); *C23C 14/083* (2013.01); *C23C 14/086* (2013.01); *C23C 14/3492* (2013.01); *C23C 14/5813* (2013.01); *C30B 1/023* (2013.01); *C30B 29/16* (2013.01); *C01P 2002/54* (2013.01); *C01P 2002/72* (2013.01)

(58) Field of Classification Search
CPC ... H01L 45/1233; H01L 45/06; H01L 45/144; H01L 27/2409; H01L 45/126; H01L 45/1675; H01L 45/1683
USPC ......... 428/432, 426, 428, 446, 448, 689, 699, 428/701, 702; 427/160, 168
See application file for complete search history.

(56) References Cited

U.S. PATENT DOCUMENTS

| | | | |
|---|---|---|---|
| 5,904,770 A | 5/1999 | Ohtani et al. | 117/103 |
| 6,037,289 A * | 3/2000 | Chopin | B82Y 30/00 106/287.16 |

(Continued)

OTHER PUBLICATIONS

Bak, T. et al., "Photo-Electrochemical Hydrogen Generation from Water Using Solar Energy. Materials-Related Aspects," International Journal of Hydrogen Energy 27 (2002) pp. 991-1022.

(Continued)

*Primary Examiner* — Mary Wilczewski
*Assistant Examiner* — Tsz Chiu
(74) *Attorney, Agent, or Firm* — Brinks Gilson & Lione

(57) ABSTRACT

A method of making a doped metal oxide comprises heating a first doped metal oxide with a laser, to form a crystallized doped metal oxide. The crystallized doped metal oxide has a different crystal structure than the first doped metal oxide.

12 Claims, 3 Drawing Sheets

A

B

(51) Int. Cl.
*C01G 19/02* (2006.01)
*C01G 23/047* (2006.01)
*C23C 14/08* (2006.01)
*C23C 14/34* (2006.01)
*C23C 14/58* (2006.01)
*C30B 1/02* (2006.01)
*C30B 29/16* (2006.01)
*C01B 13/14* (2006.01)

(56) References Cited

U.S. PATENT DOCUMENTS

| | | | |
|---|---|---|---|
| 6,103,363 A * | 8/2000 | Boire | C03C 17/002 427/164 |
| 6,344,288 B1 * | 2/2002 | Oyama et al. | 428/701 |
| 7,083,676 B2 | 8/2006 | Chang | 117/3 |
| 7,629,040 B2 * | 12/2009 | Yaoita et al. | 428/213 |
| 7,785,501 B2 * | 8/2010 | Segawa | G02B 5/003 252/520.22 |
| 8,025,929 B2 * | 9/2011 | Jongerden et al. | 427/419.2 |
| 2001/0031365 A1 * | 10/2001 | Anderson et al. | 428/432 |
| 2002/0072191 A1 | 6/2002 | Aoki et al. | 438/396 |
| 2005/0156256 A1 * | 7/2005 | Kim | C23C 16/40 257/410 |
| 2005/0260357 A1 * | 11/2005 | Olsen | C23C 16/401 427/569 |
| 2006/0088986 A1 | 4/2006 | Lin et al. | 438/482 |
| 2007/0026168 A1 * | 2/2007 | Kishimoto et al. | 428/1.6 |
| 2007/0190765 A1 | 8/2007 | Xie et al. | 438/585 |
| 2008/0073573 A1 | 3/2008 | Takami et al. | 250/492.2 |
| 2008/0075844 A1 * | 3/2008 | Ha | C04B 35/56 427/126.1 |
| 2008/0199670 A1 * | 8/2008 | Yaoita | B32B 17/10036 428/213 |
| 2009/0258470 A1 * | 10/2009 | Choi | C23C 16/308 438/386 |
| 2012/0126300 A1 * | 5/2012 | Park | H01G 4/20 257/296 |
| 2012/0301692 A1 * | 11/2012 | Dusoulier et al. | 428/215 |
| 2013/0136932 A1 * | 5/2013 | Hassan et al. | 428/432 |

OTHER PUBLICATIONS

Deb, Satyen K., "*Dye-Sensitized TiO$_2$ Thin-Film Solar Cell Research at the National Renewable Energy Laboratory (NREL)*," Solar Energy Materials & Solar Cells 88, (2005) pp. 1-10.

Fu, Hongbo et al., "*Electron Spin Resonance Spin-Trapping Detection of Radical Intermediates in N-Doped TiO$_2$-Assisted Photodegradation of 4-Chlorophenol*," J. Phys. Chem. B 110 (7) (2006) pp. 3061-3065.

Li, Qi et al., "*Heavily Nitrogen-Doped Dual-Phase Titanium Oxide Thin Films by Reactive Sputtering and Rapid Thermal Annealing*," J. Am. Ceram. Soc. 91 (10) (2008) pp. 3167-3172.

Sameshima, T. et al., "*Mechanism of Pulsed Laser-Induced Amorphization of Silicon Films*," Appl. Phys. Lett. 59 (1991) pp. 2724-2726.

International Search Report and Written Opinion dated Oct. 14, 2010 for International Application No. PCT/US2010/024540, International Publication No. WO 2010/104656 A3, filed Feb. 18, 2010 pp. 1-9.

* cited by examiner

A

B

RAPID CRYSTALLIZATION OF HEAVILY DOPED METAL OXIDES AND PRODUCTS PRODUCED THEREBY

RELATED APPLICATIONS

The present patent document is the national stage of International Application No. PCT/US2010/024540, which was filed on Feb. 18, 2010, and which claims the benefit of the filing date under 35 U.S.C. §119(e) of U.S. Provisional Patent Application Ser. No. 61/160,109, which was filed on Mar. 13, 2009, both of which are hereby incorporated by reference in their entirety.

FEDERALLY SPONSORED RESEARCH OR DEVELOPMENT

The subject matter of this application has been funded in part under a research grant from the National Science Foundation, under Center of Advanced Materials for the Purification of Water with Systems Grant Number CTS-0120978. The U.S. Government has certain rights in this invention.

BACKGROUND

Metal oxide materials are used for a variety of applications, including catalysis, coatings, sensors, electronics, and semiconductor devices. The physical and chemical properties of metal oxides can be modified by adding one or more other elements to the metal and the oxygen in the material. These added elements are referred to as dopants, and the resulting material is referred to as a doped metal oxide.

For example, tin oxide (empirical formula $SnO_2$) is present in a variety of commercial products. Sensors for gases such as oxygen, hydrocarbons or carbon monoxide may include tin oxide on a solid support. Sensors containing tin oxide typically are heated to 400° C. to enable the sensing function. Heavy doping of the tin oxide may increase its carrier concentration, allowing it to be used for sensing at lower temperatures. Indium tin oxide (ITO), which includes tin oxide as a dopant in the indium oxide, is widely used as a transparent electrical conductor for applications in displays, electro-optic sensors, and light emitting diodes (LEDs). Doping of tin oxide may provide an alternative to ITO, which faces future supply problems due to the scarcity of indium.

In another example, titanium oxide (empirical formula $TiO_2$) has been extensively studied as an efficient photocatalyst under ultraviolet (UV) light. Photocatalysts provide for catalysis of chemical reactions when irradiated by electromagnetic radiation, and have been investigated for applications in a variety of areas, including environmental remediation. Stable catalysts that promote oxidation reactions can break down pollutants in air and/or in water into substances that are less harmful. Anionic doping of titanium oxide can produce a red-shift in the light absorbance of the metal oxide. This can lead to photocatalysis under visible-light irradiation, allowing a greater portion of the solar spectrum to be used for catalytic activity. Among various anion-doped titanium oxides, nitrogen-doped titanium oxide (empirical formula $TiO_{2-x}N_x$) has been explored extensively, due to the ease with which it can be formed.

The chemical and/or physical properties of a metal oxide can be affected by the physical form of the metal oxide. Some metal oxides, such as tin oxide, are amorphous until heated above a transition temperature. Other metal oxides have more than one possible crystal structure, where each crystal structure tends to form at a different temperature range. Some of these metal oxides, such as titanium oxide, have more desirable physical and/or chemical properties when at least a portion of the metal oxide is in one crystal structure than when that crystal structure is absent.

In the example of titanium oxide, the anatase crystal phase is stable at low temperatures, and the rutile crystal phase is stable at high temperatures. Heating titanium oxide above the transition temperature of 700° C. can transform some or all of the anatase phase into rutile phase. Titanium oxide that includes a mixture of the anatase and rutile phases has photocatalytic properties that are superior to titanium oxide that is either pure anatase or pure rutile. The commercially available P25 titanium oxide powder (DEGUSSA) is an example of this dual-phase crystal titanium oxide.

It has been difficult, however, to combine the advantages of doping of metal oxides with the advantages associated with desirable crystal structures. This difficulty is due at least in part to the distinct processing requirements for each of these properties, which are typically mutually exclusive. Anion dopants in a metal oxide tend to become unstable at high temperatures. Thus, doped metal oxides that are exposed to high temperatures typically lose a large proportion of their dopants. In contrast, sometimes desirable crystal structures can only be obtained at high temperatures. Thus, the temperatures at which metal oxides are doped typically cause the formation of lower temperature crystal structures or amorphous materials.

In the example of titanium oxide, dual-phase titanium oxide typically contains little or no nitrogen dopant. Attempts to introduce a nitrogen dopant have so far achieved only a 2% doping concentration (Fu, H. et al., *J. Phys. Chem. B*, 110 (7), pp. 3061-3065 (2006)). Surface nitriding treatment of other solids, such as iron, is believed to yield a significant nitrogen concentration gradient from the surface to the interior, and nitride phases often form on the surface. Since the nitride of titanium is an electronic conductor, it produces no photocatalytic effect, and its presence on the catalyst surface is to be avoided.

Sol-gel synthesis of titanium oxide, including doped titanium oxide typically requires heating to temperature of 500° C. or greater in order to obtain catalytically active crystalline materials. These temperatures are incompatible with a number of desirable substrates for thin films of these materials, such low-melting point glass and plastics. Even when the film is formed by a low temperature technique, such as by reactive sputtering, heating at high temperatures is still required to form catalytically active material.

SUMMARY

In a first aspect, the present invention includes a method of making a doped metal oxide comprising heating a first doped metal oxide with a laser, to form a crystallized doped metal oxide. The crystallized doped metal oxide has a different crystal structure than the first doped metal oxide.

In a second aspect, the present invention includes a doped metal oxide structure, comprising a substrate, a first doped metal oxide on the substrate, and a crystallized doped metal oxide on the first doped metal oxide. The crystallized doped metal oxide has a different crystal structure than the first doped metal oxide.

DEFINITIONS

The following definitions are included to provide a clear and consistent understanding of the specification and claims.

The term "dopant nonmetal" means a nonmetal element that is not oxygen; for example boron, carbon, nitrogen, fluorine, silicon, phosphorus, sulfur, chlorine, germanium, arsenic, selenium, bromine, antimony, tellurium, iodine or astatine, particularly nitrogen and fluorine.

The term "dopant nonmetal source" means a substance containing a dopant nonmetal element that is not oxygen, and optionally containing other elements.

The term "corresponding undoped metal oxide" means a metal oxide having an empirical formula similar to that of a doped metal oxide, but where the dopant is replaced with oxygen. For example, for a nitrogen-doped titanium oxide having an empirical formula of $TiO_{2-x}N_x$, the corresponding undoped metal oxide has an empirical formula of $TiO_2$.

The term "photocatalyst" means a catalyst that is dependent on the presence of electromagnetic radiation to catalyze a reaction.

The term "visible light" means electromagnetic radiation having a wavelength of 380 nm to 780 nm.

The term "heat-sensitive substrate" means a substrate that has a melting or decomposition temperature of 400° C. or less. Examples include plastics and low-melting point glass, as well as biological materials such as wood and paper.

DETAILED DESCRIPTION

Figure 1:
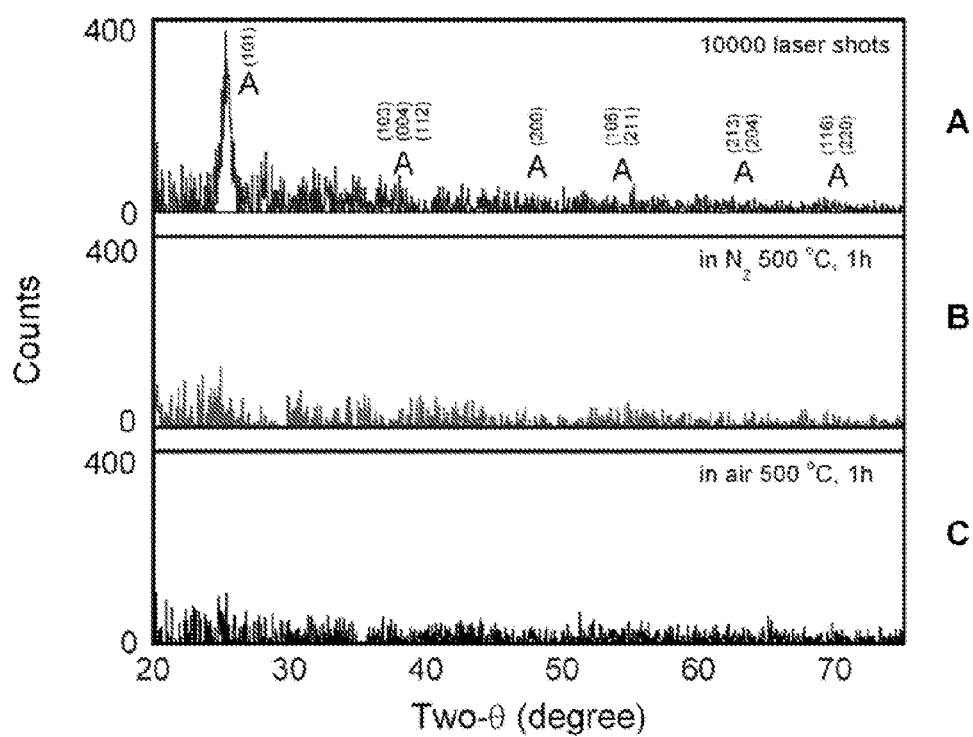
FIGS. 1A, B and C are X-ray diffraction patterns of various TiON thin film samples.

Rapid thermal annealing was investigated for the formation of doped metal oxides (Qi Li and Jian Ku Shang, Heavily Nitrogen-Doped Dual-Phase Titanium Oxide Thin Films by Reactive Sputtering and Rapid Thermal Annealing, *J. American Ceramic Society* Vol. 91, 10, pp. 3167-3172 (published online 20 Aug. 2008)). Even under these conditions, substrates which do not tolerate high temperatures, such as plastics, cannot be used.

The present invention is based on the fact that laser crystallization may be used to crystallize a thin film on a heat-sensitive substrate (T. Sameshima and S. Usui, Mechanism of pulsed laser-induced amorphization of silicon films, *Applied Physics Letters,* 59 (1991), p. 2724.). Since the penetration depth of the laser is less than the thickness of the thin film, the substrate is not heated, but nevertheless the film will be crystallized from the top through a portion of the film. This allows for a catalytically active doped metal oxide film on a heat-sensitive substrate.

A method of making a doped metal oxide includes crystallizing a first doped metal oxide by laser crystallization, to form a crystallized doped metal oxide. The crystal structure of the crystallized doped metal oxide is different from the crystal structure of the first doped metal oxide. Typically, the first doped metal oxide is amorphous.

The first doped metal oxide includes a metal, oxygen, and a dopant element. The first doped metal oxide may be characterized in terms of its elemental composition. The atomic ratio of metal to oxygen to dopant may be 1:0.5-1.99:0.01-1.5, particularly in case where the metal is Ti or Sn, and the nonmetal dopant is N or F. Preferably the atomic ratio of metal to oxygen to dopant is 1:1.0-1.98:0.02-1.0; more preferably is 1:1.5-1.95:0.05-0.5, and more preferably is 1:1.8-1.9:0.1-0.2. Preferably the metal is titanium, or tin, and the dopant nonmetal is nitrogen or fluorine. Preferably, the doped metal oxide is a semiconductor oxide, more preferably an N-type doped semiconductor oxide.

The first doped metal oxide preferably includes a metal, oxygen, and a dopant nonmetal. Preferably the dopant nonmetal is boron, carbon, nitrogen, fluorine, silicon, phosphorus, sulfur, chlorine, germanium, arsenic, selenium, bromine, antimony, tellurium, iodine or astatine. More preferably the dopant nonmetal is boron, carbon, nitrogen, fluorine or chlorine. More preferably the dopant nonmetal is nitrogen or fluorine. The atomic ratio of metal to oxygen to dopant nonmetal may be 1:0.5-1.99:0.01-1.5. Preferably the atomic ratio of metal to oxygen to dopant nonmetal is 1:1.0-1.98:0.02-1.0; more preferably is 1:1.5-1.95:0.05-0.5, and more preferably is 1:1.8-1.9:0.1-0.2.

The first doped metal oxide may include one type of dopant element, or it may include two or more types of dopant elements. For example, the first doped metal oxide may include a dopant nonmetal and a dopant metal. Examples of metal oxides that include two or more types of dopants include quaternary titanium oxides, such as titanium oxide doped with nitrogen and a transition metal, such as palladium silver, yttrium, platinum, strontium, tungsten, copper, neodymium, nickel, cobalt or vanadium. Quaternary titanium oxides are described, for example, in U.S. Patent Application Publication No. 2007/0190765 A1 to Rong-Cai Xie et al. Preferably, if a dopant metal is present, its concentration in the first doped metal oxide is at most 10 percent by weight (wt %). More preferably the concentration of dopant metal is at most 5 wt %, and more preferably is at most 2 wt %.

A corresponding undoped metal oxide of the first doped metal oxide may form a variety of crystal structures or phases. The crystallized doped metal oxide having a corresponding undoped metal oxide that may form a high temperature crystal phase and/or a low temperature crystal phase. In one example, the first doped metal oxide is a nitrogen-doped titanium oxide having an empirical formula of $TiO_{2-x}N_x$; the crystallized doped metal oxide may be present in the anatase phase, the rutile phase, or a combination of both. In this example, the atomic ratio of titanium to oxygen to nitrogen may be 1:0.5-1.99:0.01-1.5. Preferably the atomic ratio of titanium to oxygen to nitrogen is 1:1.0-1.98:0.02-1.0; more preferably is 1:1.5-1.95:0.05-0.5, and more preferably is 1:1.8-1.9:0.1-0.2. These atomic ratios correspond to nitrogen to titanium atomic ratios (N:Ti) of 1-150%, 2-100%, 5-50% and 10-20%, respectively. For example, the nitrogen to titanium atomic ratios (N:Ti) could be greater than 5%, such as 5-10%, 5-9.5%, or 5-9%.

In another example, the first doped metal oxide is a nitrogen-doped tin oxide having an empirical formula of $SnO_{2-x}N_x$. In this example, the atomic ratio of tin to oxygen to nitrogen may be 1:0.5-1.99:0.01-1.5. Preferably the atomic ratio of tin to oxygen to nitrogen is 1:1.0-1.98:0.02-1.0; more preferably is 1:1.5-1.95:0.05-0.5, and more preferably is 1:1.8-1.9:0.1-0.2. These atomic ratios correspond to nitrogen to tin atomic ratios (N:Sn) of 1-150%, 2-100%, 5-50% and 10-20%, respectively.

In a third example, the first doped metal oxide is a fluorine-doped titanium oxide having an empirical formula of $TiO_{2-x}F_x$; the crystallized doped metal oxide may be present in the anatase phase, the rutile phase, or a combination of both. In this example, the atomic ratio of titanium to oxygen to fluorine may be 1:0.5-1.99:0.01-1.5. Preferably the atomic ratio of titanium to oxygen to fluorine is 1:1.0-1.98:0.02-1.0; more preferably is 1:1.5-1.95:0.05-0.5, and more preferably is 1:1.8-1.9:0.1-0.2. These atomic ratios correspond to fluorine to titanium atomic ratios (F:Ti) of 1-150%, 2-100%, 5-50% and 10-20%, respectively. For example, the fluorine to titanium atomic ratios (F:Ti) could be greater than 5%, such as 5-10%, 5-9.5%, or 5-9%.

In a fourth example, the first doped metal oxide is a fluorine-doped tin oxide having an empirical formula of $SnO_{2-x}F_x$. In this example, the atomic ratio of tin to oxygen to fluorine may be 1:0.5-1.99:0.01-1.5. Preferably the atomic ratio of tin to oxygen to fluorine is 1:1.0-1.98:0.02-1.0; more preferably is 1:1.5-1.95:0.05-0.5, and more preferably is 1:1.8-1.9:0.1-0.2. These atomic ratios correspond to fluorine to tin atomic ratios (F:Sn) of 1-150%, 2-100%, 5-50% and 10-20%, respectively.

The first doped metal oxide may be formed by reactive sputtering. The reactive sputtering may include sputtering a target that includes the metal or an oxide of the metal in an atmosphere that includes a dopant nonmetal source. The atmosphere may further include one or more other gases, such as oxygen, nitrogen, fluorine, $NF_3$, argon, or combinations thereof. Reactive sputtering can provide for incorporation of a high concentration of dopant nonmetal in the doped metal oxide. The reactive sputtering may be performed at temperatures below those typically used for forming coatings by sputtering. Preferably the reactive sputtering is performed at a temperature of at most 200° C., more preferably of at most 100° C., more preferably of at most 50° C., and more preferably of at most 30° C. Preferably the reactive sputtering is performed at room temperature. The atomic ratio of metal to oxygen to dopant nonmetal in the first doped metal oxide may be controlled by adjusting a variety of process conditions, including the chemical composition and concentration of the dopant nonmetal source in the deposition atmosphere, and the chemical composition of the target.

In one example, formation of the first doped metal oxide may include forming a nitrogen-doped titanium oxide by sputtering a titanium target or a titanium oxide target, in an atmosphere containing $N_2$, at room temperature. The atmosphere may also include $O_2$. A thin film having an empirical formula of $TiO_{2-x}N_x$ may be formed on a substrate by this process. The atomic ratio of titanium to oxygen to nitrogen in the first doped metal oxide may be controlled by adjusting a variety of process conditions, including the ratio of $N_2$ to $O_2$ in the deposition atmosphere, and the chemical composition of the target.

In another example, formation of the first doped metal oxide may include forming a nitrogen-doped tin oxide by sputtering a tin target or a tin oxide target, in an atmosphere containing $N_2$, at room temperature. The atmosphere may also include $O_2$. A thin film having an empirical formula of $SnO_{2-x}N_x$ may be formed on a substrate by this process. The atomic ratio of tin to oxygen to nitrogen may be controlled by adjusting a variety of process conditions, including the ratio of $N_2$ to $O_2$ in the deposition atmosphere, and the chemical composition of the target. Other nonmetal dopants, such as fluorine may also be introduce in the gas phase, for example by the inclusion of $NF_3$ gas in the deposition atmosphere, or by inclusion of fluorine in the metal targets.

Dopant metals may also be included, for example by using multiple targets in the sputtering device (for example, a target of tin and a target of zinc or indium), or a target which is an alloy of two or more metals (such as a target containing both indium and tin, or both zinc and tin). One or more nonmetal dopants may also be included in the target, if desired.

Figure 3:
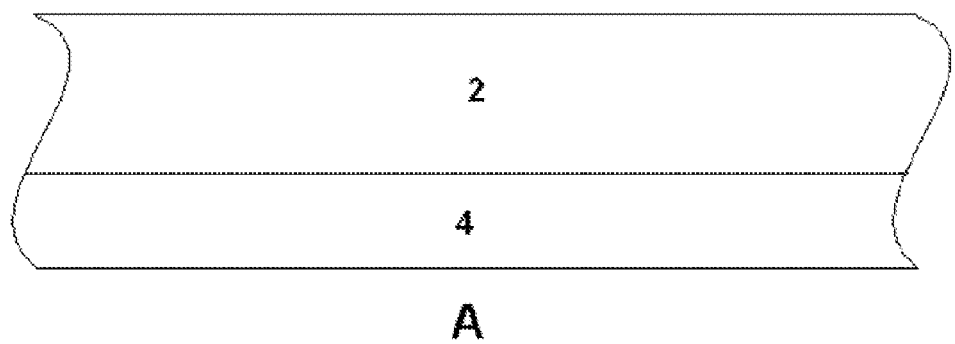
FIG. 3A illustrates a first doped metal oxide on a substrate.
FIG. 3B illustrates a crystallized doped metal oxide on a first doped metal oxide (which may be amorphous) on a substrate.
Figure 3:
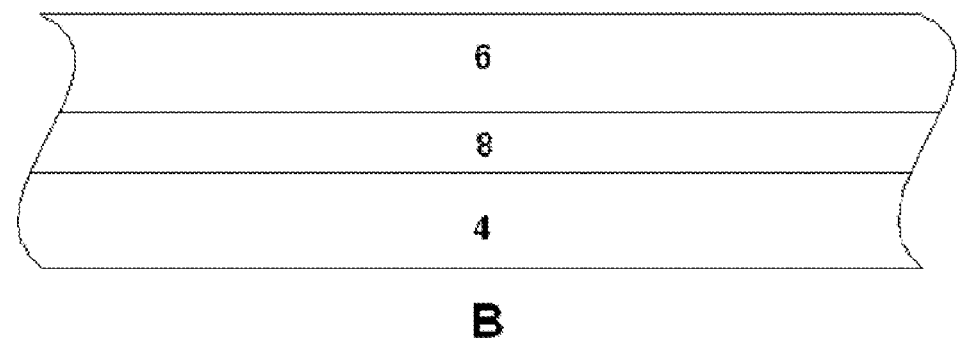

Preferably, a laser is used to crystallize the film. The laser must be of high enough intensity to crystallize the film, but which does not penetrate greater than the film thickness. Examples of lasers include KrF excimer laser (193 nm wave length), or a $CO_2$ laser, which has a greater wave length and hence a greater penetration depth. Preferably, the laser penetrates the film of the first doped metal oxide to a depth of 10 micrometers or less, more preferably 5 micrometers or less, including less than 2 micrometers or less, or even 1 micrometer or less. Correspondingly, the film depth is greater than the penetration depth of the laser, such as 1 micrometer or more, more preferably 2 micrometers or more, including 5 micrometers or more, or even 10 micrometer or more, such as 10-20 micrometers; this corresponds to the thickness of the first doped metal oxide before crystallization. Prior to crystallization a layer of the first doped metal oxide 2 is on a substrate 4, as illustrated in FIG. 3 A; and after being crystallized the structure produced may included a crystalline doped metal oxide layer 6, on an amorphous or first doped metal oxide layer 8, on a substrate 4, such as a heat-sensitive substrate, as illustrated in FIG. 3 B.

The atomic ratio of metal to oxygen to dopant may be 1:0.5-1.99:0.01-1.5. Preferably the atomic ratio of metal to oxygen to dopant is 1:1.0-1.98:0.02-1.0; more preferably is 1:1.88-1.98:0.02-0.12, and more preferably is 1:1.9-1.97:0.03-0.10. Preferably the amount of dopant in the crystallized doped metal oxide is at least 5% of the amount of dopant in the first doped metal oxide. More preferably the amount of dopant in the crystallized doped metal oxide is at least 10% of the amount of dopant in the first doped metal oxide, more preferably is at least 20% of the amount of dopant in the first doped metal oxide, more preferably is at least 30% of the amount of dopant in the first doped metal oxide, more preferably is at least 50% of the amount of dopant in the first doped metal oxide, more preferably is at least 75% of the amount of dopant in the first doped metal oxide, and more preferably is at least 85% of the amount of dopant in the first doped metal oxide.

The first doped metal oxide is present as a film on a substrate; after rapid crystallization the crystallized doped metal oxide will be present on a substrate. Examples of substrate materials include glass, ceramic, metal, plastic and paper. The substrate may be porous or non-porous. Examples of porous substrate include a mat of fibers, a zeolite, or a porous plastic film. The substrate may be a heat-sensitive substrate, which melts or decomposes at a temperature of 400° C. or less, or 350° C. or less, 300° C. or less, or even 250° C. or less or 200° C. or less. Examples included plastics, polymers, low-melting point glass, organic materials such as paper or wood, or other materials of biological origin, polyamides such as nylons; polyesters such as poly(ethylene terephthalate) and polycaprolactone; polycarbonates; polyethers such as epoxides; polyimides such as polypyromellitimide; phenol-formaldehyde resins; amine-formaldehyde resins such as a melamine resin; polysulfones; poly(acrylonitrile-butadiene-styrene) (ABS); polyurethanes; polyolefins such as polyethylene, polystyrene, polyacrylonitrile, polyvinyls, polyvinyl chloride, poly(DCPD) and poly(methyl methacrylate); polysilanes such as poly(carborane-siloxane); polyurethanes, natural and synthetic fibers, HEPA filters, e-glass fibers, synthetic fibers used in clothing, polyethylene terephthalate, nylon 6, nylon 66, polypropylene, liquid crystalline polyesters, syndiotactic polystyrene and polyphosphazenes. Other examples of substrates which are not heat-sensitive substrates, but which may also be used, include glass fibers; mineral fibers such as asbestos and basalt; ceramic fibers such as SiC, and BN; metal fibers such as iron, nickel and platinum.

The doped metal oxide compositions including the doped titanium oxide may be used to facilitate a wide variety of reactions. For example, the doped metal oxide may be catalytic compositions, which may be mixed with a reactant fluid and irradiated with visible light, providing for a chemical reaction of one or more ingredients of the fluid. The catalytic composition may then be recovered from the fluid and recycled for use in another portion of reactant fluid. Depending on the application and on the dopants in the doped titanium oxide, a catalytic composition containing the doped titanium oxide may be used in place of general metal catalysts such as cobalt, nickel, copper, gold, iridium, lanthanum, nickel, osmium, platinum, palladium, rhodium, ruthenium, silver, strontium, yttrium, zirconium and tin.

In another example, the catalytic composition including the doped titanium oxide may be present on a surface that is exposed to dirt, grease and other organic and inorganic contaminants. Such a surface may be "self-cleaning" when exposed to visible light. A self-cleaning surface may include a coating on a substrate, where the coating includes the catalytic composition. In one example, a self-cleaning glass may have a transparent or translucent coating including the catalytic composition on one or both sides of the glass. Contaminants that contact the glass may then be degraded when the glass is exposed to visible light. It may be desirable for self-cleaning glass to have a hydrophilic surface, to provide for rinsing of any remaining degradation products from the glass with water. Examples of self-cleaning glass having surface coatings of titanium oxide include SunClean® glass (PPG Industries, Pittsburgh, Pa.) and Activ™ glass (Pilkington, Toledo, Ohio). A self-cleaning surface having a coating that includes the catalytic composition may also remove fingerprints from the surface automatically upon exposure to visible light.

In another example, the catalytic composition including the doped titanium oxide may be present on a surface that is exposed to microbes, such as bacteria and fungi, and/or to viruses. Such a surface may be a "disinfecting surface" by destroying or inactivating microbes or viruses that are present on the surface. For example, surfaces in residential, commercial or hospital environments may have a coating of the catalytic composition on the surface. Examples of surfaces that may be made into disinfecting surfaces include countertops, flooring, walls, handles, telephones, and surfaces of medical instruments.

For example, the doped titanium oxide may be mixed with contaminated air or water and irradiated with visible light. Contaminants in the air or water may be degraded into substances that are volatile or that are more easily separated from the fluid. For example, contaminants containing organic substances and halogenated substances may be degraded into carbon dioxide and halide ions, which then may be separated from the air or water. In the case of air purification, the degradation of contaminants also may result in control of odors in the air. Examples of water purification systems that use titanium oxide and UV radiation include the Photo-Cat® system (Purifics® ES Inc., London, Ontario, CA) and the water treatment system from Matrix Photocatalytic, Inc. (London, Ontario, CA). Examples of air purification systems that use titanium oxide and UV radiation include the air treatment system from Matrix Photocatalytic, Inc. These systems may be modified using nitrogen doped titanium oxide, or quaternary titanium oxide, prepared according to the present invention, which replaces the titanium oxide; the UV radiation may then be replaced with visible light, either produced from a visible light source, or natural visible light (such as solar radiation).

The doped titanium oxide having an atomic ratio of dopant nonmetal to titanium of from 2% to 20%, and in which preferably at least 10% of the doped titanium oxide is in the rutile phase, may be used for the production of hydrogen and oxygen from water. Splitting of water into hydrogen gas and oxygen gas using titanium oxide and UV radiation is described, for example, in T. Bak et al., *International Journal of Hydrogen Energy*, 27, 991-1022 (2002). Water may be decomposed into hydrogen and oxygen by photocatalysis with the doped titanium oxide, when irradiated with visible light. This decomposition also may be carried out in a photoelectrochemical cell having a photo-anode containing the doped titanium oxide. It may be desirable to use a photoelectrochemical cell, as this can provide for separate collection of hydrogen and oxygen from the cell.

The doped titanium oxide having an atomic ratio of dopant nonmetal to titanium of from 2% to 20%, and in which preferably at least 10% of the doped titanium oxide is in the rutile phase, may be used for the production of electricity from solar radiation. Solar cells containing titanium oxide and a dye for sensitizing the titanium oxide are described, for example, in S. K. Deb, *Solar Energy Materials & Solar Cells*, 88, 1-10 (2005). Electric current may be produced when dye molecules are excited by exposure to light, transferring electrons into the conduction band of the doped titanium oxide. The doped titanium oxide may conduct the electrons to a current collector that is connected to an electrical circuit with a load.

A doped tin oxide, such as a doped tin oxide formed by the above method, may include tin, oxygen and a dopant nonmetal, where the atomic ratio of dopant nonmetal to tin (dopant:Sn) is from 2% to 20%, and preferably at least 50% of the doped tin oxide is in the rutile phase. Preferably the atomic ratio of dopant nonmetal to tin is from 2% to 12%, and more preferably is from 3% to 10%. Preferably at least 70% of the second doped metal oxide is in the rutile crystal phase, and more preferably at least 90% of the second doped metal oxide is in the rutile crystal phase.

The doped tin oxide having an atomic ratio of dopant nonmetal to tin of from 2% to 20%, and in which preferably at least 50% of the doped tin oxide is in the rutile phase, may be used for sensing gases. The electrical conductivity of the doped tin oxide may vary depending on the chemical composition of its environment, and this variable conductivity may provide for the use of the doped tin oxide to measure the identity and/or amount of one or more gases. The electrical resistance of the doped tin oxide or a material containing the doped tin oxide may be measured in an environment and compared with the electrical resistance in a control environment. The difference between the measured resistance and the control resistance may be correlated with the amount and/or identity of a gas in the environment. Examples of gases that may be identified and/or measured include oxygen, hydrogen, carbon monoxide, hydrogen sulfide, and water. Preferably a gas sensor using the doped tin oxide can be used to sense gases at ambient conditions. In one example, a gas sensor using the doped tin oxide may be present in an automobile exhaust system, where the sensor may be used for identifying and/or quantifying one or more gases in the exhaust system.

EXAMPLES

Example 1

Crystallized TiON thin films were created by the reactive DC magnetron sputtering technique followed with a laser annealing process. Thin film samples were firstly deposited onto glass slide substrates with an ATC 2000 custom four gun Co-sputtering system. The deposition took place at room temperature, and the glass slide substrate was rotated continually to produce uniform thin films. To crystallize the as-deposited amorphous thin film samples, a laser annealing process was used. The TiON samples were then exposed to light pulses from a KrF excimer laser (193 nm) with a repetition rate of 5 Hz for various shot times. The fluence incident on the sample is ~0.34 J/cm$^2$. For comparison purpose, traditional thermal annealing was also conducted on the same as-deposited samples by holding samples at 500° C. for 1 hour in either air or a continuous flow of N$_2$ gas.

The X-ray diffraction (XRD) patterns of various TiON thin film samples are shown in FIG. 1. The TiON thin film sample exposed to 10000 laser shots demonstrates a clear anatase crystal structure, while both samples with thermal annealing only show very weak reflection peaks, indicating that their crystallizations were just in the beginning stage.

X-ray photoelectron spectroscopy (XPS) was used to obtain semi-quantitative data on chemical compositions. The N/Ti atomic ratio of various TiON thin film samples were summarized in Table 1. For samples made by thermal annealing, a large portion of nitrogen dopants (over 50%) got away during the thermal annealing process, although N$_2$ gas atmosphere was helpful in maintaining a little bit higher nitrogen dopant concentration in the obtained sample. Even so, they only have poor crystallization due to the substrate constraint effect on thin film samples. However, TiON sample made by laser annealing shows minimal loss of nitrogen dopants during its crystallization. Compared with the traditional thermal annealing, laser annealing demonstrates its superior capability to crystallize TiON samples with almost no dopant loss.

TABLE 1

N/Ti atomic ratio and crystallization level of TiON thin film samples

|  | As-deposited sample | After 10000 Laser Shots | 500° C., 1 h in air | 500° C., 1 h in N$_2$ |
|---|---|---|---|---|
| N/Ti Atomic Ratio | 9.66% | 9.52% | 4.15% | 4.36% |
| N-dopant Residue | — | 98.6% | 43.0% | 45.1% |
| Crystallization Level | amorphous | crystallized | Poorly crystallized | Poorly crystallized |

Figure 2:
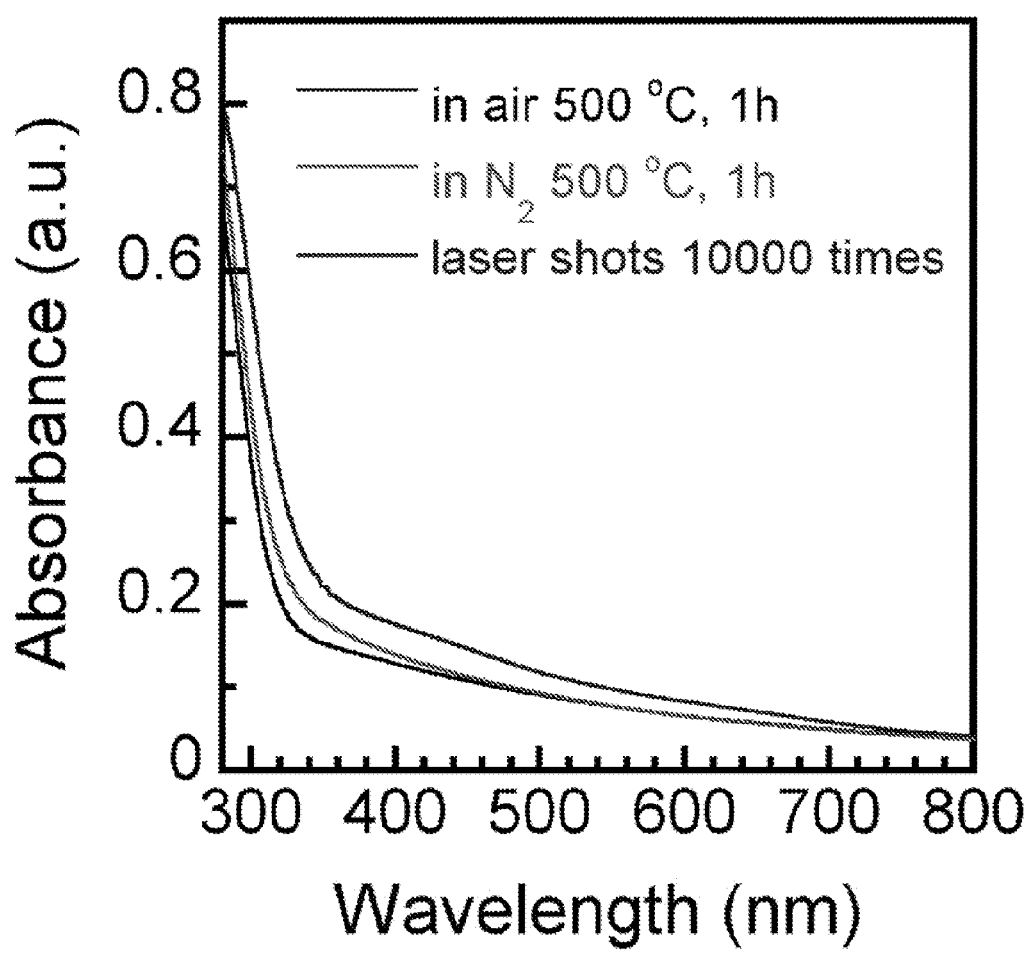
FIG. 2 is a graph comparing the light absorption properties of various TiON thin film samples.

In FIG. 2, the light absorption properties of TiON thin film made by laser annealing are compared with those of samples with thermal annealing, which were collected by a diode array spectrophotometer in the transmission mode. TiON thin film made by laser annealing demonstrates the best visible light absorbance, which is in accordance to its high nitrogen dopant concentration.

What is claimed is:

1. A doped metal oxide structure, comprising:
a substrate,
a first doped metal oxide on the substrate, the first doped metal oxide comprising a metal oxide and a dopant nonmetal, wherein the atomic ratio of metal to oxygen to the dopant nonmetal in the first doped metal oxide is 1:0.5-1.99:0.01-1.5, and
a crystallized doped metal oxide directly on the first doped metal oxide, the crystallized doped metal oxide comprising the same metal oxide and the same dopant nonmetal as the first doped metal oxide, wherein an amount of the dopant nonmetal in the crystallized doped metal oxide is at least 50% of the amount of the dopant nonmetal in the first doped metal oxide,
wherein the crystallized doped metal oxide has a different crystal structure than the first doped metal oxide.

2. The structure of claim 1, wherein the dopant nonmetal is nitrogen or fluorine, and the first doped metal oxide comprises a metal selected from titanium and tin.

3. The structure of claim 1, wherein the crystallized doped metal oxide is one of nitrogen doped titanium oxide and fluorine doped titanium oxide.

4. The structure of claim 1, wherein the crystallized doped metal oxide is one of nitrogen doped tin oxide and fluorine doped tin oxide.

5. The structure of claim 1, wherein the first doped metal oxide is amorphous.

6. The structure of claim 1, wherein the atomic percent of dopant nonmetal to metal in the crystallized doped metal oxide is 5-10%.

7. The structure of claim 1, wherein the substrate is a heat-sensitive substrate.

8. The structure of claim 7, wherein the heat-sensitive substrate comprises a polymer.

9. The structure of claim 1, wherein the first doped metal oxide and the crystallized doped metal oxide have a combined thickness of 1-20 micrometers.

10. A doped metal oxide structure comprising:
a substrate;
a first doped metal oxide on the substrate, the first doped metal oxide comprising a metal oxide and a dopant nonmetal; and
a crystallized doped metal oxide directly on the first doped metal oxide, the crystallized doped metal oxide comprising the same metal oxide and the same dopant nonmetal,
wherein the crystallized doped metal oxide has a different crystal structure than the first doped metal oxide, and
wherein an atomic ratio of metal to oxygen to the dopant nonmetal in the first doped metal oxide is 1:0.5-1.99: 0.01-1.5.

11. The doped metal oxide structure of claim 10, an amount of the dopant nonmetal in the crystallized doped metal oxide is at least 10% of the amount of the dopant nonmetal in the first doped metal oxide.

12. The doped metal oxide structure of claim 11, wherein the amount of the dopant nonmetal in the crystallized doped metal oxide is at least 50% of the amount of the dopant nonmetal in the first doped metal oxide.

* * * * *